United States Patent
Ozaki

Patent Number: 6,028,443
Date of Patent: Feb. 22, 2000

[54] TEST CIRCUIT FOR SEMICONDUCTOR INTEGRATED LOGIC CIRCUIT USING TRISTATE BUFFERS ALLOWING CONTROL CIRCUIT FOR TRISTATE TO BE TESTED

[75] Inventor: Hideharu Ozaki, Tokyo, Japan

[73] Assignee: NEC Corporation, Japan

[21] Appl. No.: 08/948,919

[22] Filed: Oct. 10, 1997

[30] Foreign Application Priority Data

Oct. 11, 1996 [JP] Japan .................................. 8-289156

[51] Int. Cl.[7] .................................................. H03K 19/00
[52] U.S. Cl. .............................................................. 326/16
[58] Field of Search ....................... 326/16, 56; 702/120; 714/126, 724, 726, 729, 733, 743; 324/73.1

[56] References Cited

U.S. PATENT DOCUMENTS

| | | | |
|---|---|---|---|
| 4,669,081 | 5/1987 | Mathewes et al. | 714/726 |
| 5,107,148 | 4/1992 | Millman | 326/56 |
| 5,136,185 | 8/1992 | Fleming et al. | 326/16 |
| 5,159,263 | 10/1992 | Yaguchi | 714/726 |
| 5,285,119 | 2/1994 | Takahashi | 326/16 X |
| 5,561,614 | 10/1996 | Revilla et al. | 702/120 |
| 5,671,233 | 9/1997 | Kamada . | |

*Primary Examiner*—Michael Tokar
*Assistant Examiner*—Patrick Wamsley

[57] ABSTRACT

In a semiconductor integrated logic circuit including a tri-state output buffer having three different output conditions of a logical high level, a logical low level and a high impedance condition, and an internal control circuit generating a control signal for controlling the tri-state output buffer, a first selector is provided which has a first input receiving a data signal outputted from an internal logic circuit, a second input connected to receive the control signal, and an output connected to an data input of the tri-state output buffer. A second selector is provided which has a first input connected to receive the control signal, and a second input connected to a logic high level which brings the tri-state buffer into an output enable condition in which the tri-state output buffer outputs either the logical high level or the logic low level. An output of the second selector is connected to a control input of the tri-state output buffer. A common switch signal is supplied in common to an selection control input of each of the first and second selectors. When the common switch signal is indicative of a test mode, the first selector selects and outputs the control signal to the data input of the tri-state output buffer and the second selector selects and outputs the logic high level to the control input of the tri-state output buffer so that the tri-state buffer is brought in the output enable condition so as to output the control signal.

2 Claims, 3 Drawing Sheets

*Fig. 2*

| TEST SWITCH SIGNAL | CONTROL CIRCUIT OUTPUT | INTERNAL DATA SIGNAL | OUTPUT TERMINAL |
|---|---|---|---|
| NORMAL | H | H | H |
| NORMAL | H | L | L |
| NORMAL | L | X | Hiz |
| TEST | H | X | H |
| TEST | L | X | L |

TEST CIRCUIT FOR SEMICONDUCTOR INTEGRATED LOGIC CIRCUIT USING TRISTATE BUFFERS ALLOWING CONTROL CIRCUIT FOR TRISTATE TO BE TESTED

BACKGROUND OF THE INVENTION

1. Field of the Invention

The present invention relates to a semiconductor integrated logic circuit, and more specifically to a test circuit for use in a semiconductor integrated logic circuit, for facilitating a test of a circuit generating a control signal used for controlling a tri-state buffer configured to assume a high impedance output condition in addition to a logical high level signal outputting condition and a logical low level signal outputting condition, or a bi-directional (input/output) buffer ordinarily including the tri-state buffer therein.

2. Description of Related Art

For example, Japanese Patent Application Pre-examination Publication No. JP-A-63-070175, the content of which is incorporated by reference in its entirety into this application (an English abstract of JP-A-63-070175 is available from the Japanese Patent Office, and the content of the English abstract of JP-A-63-070175 is incorporated by reference in its entirety into this application), proposes a test method for detecting that, in a logic circuit for generating a control signal for switching a tri-state circuit between an output enable condition (of outputting either a logical high level signal or a logical low level signal) and a high impedance output condition, there occurs such a trouble that an output of the logic circuit is ceaselessly fixed to a logical high level or a logical low level. In this trouble, the output condition of the tri-state buffer an no longer be changed over. For making it possible to detect this type of trouble, a high impedance condition of the tri-state circuit output is added as an expected output value.

Alternatively, Japanese Patent Application Pre-examination Publication No. JP-A-63-295980, the content of which is incorporated by reference in its entirety into this application (an English abstract of JP-A-63-295980 is available from the Japanese Patent Office, and the content of the English abstract of JP-A-63-295980 is incorporated by reference in its entirety into this application), proposes an input/output circuit having such a construction that each input/output buffer of an input/output circuit and an internal circuit of a semiconductor integrated circuit can be electrically separated from each other, and the separated input/output buffer can be electrically connected to another input/output buffer so that in order to detect a possible trouble of the input/output buffer, the output/output buffer can be tested independently of the internal circuit without operating the internal circuit.

The above mentioned prior art for testing the logic circuit for generating the control signal for controlling the output condition of the tri-state circuit has the following problems:

A first problem is that a test circuitry for testing the high impedance condition of a "circuit or a device under test", is seldom used in ordinary cases. The reason for this is as follows:

A procedure for testing the high impedance condition of the "circuit under test", is complicated, with the result that the testing system is expensive. Furthermore, even in a testing system having a function of testing the high impedance condition, the testing of the high impedance condition in the tri-state buffer is conducted in a functional test by checking whether or not the output terminal becomes a logical high level when the output terminal is pulled up to a high level voltage, and then, by checking whether or not the output terminal becomes a logical low level when the output terminal is pulled down to a low level voltage. Namely, the testing of two times is ordinarily required.

A second problem is that although the control of the tri-state buffer can be tested, a logic circuit connected to the control signal cannot be tasted. The reason for this is that, although the tri-state buffer can be tested by supplying another signal to the input of the tri-state buffer as shown in JP-A-63-295980, it is not possible to test an operation of an circuit which is provided before the tri-state buffer and which is typified by the logic circuit for generating the control signal.

SUMMARY OF THE INVENTION

Accordingly, it is an object of the present invention to provide a semiconductor integrated logic circuit which has overcome the above mentioned defects of the conventional ones.

Another object of the present invention is to provide a semiconductor integrated logic circuit making it possible to testing a circuit generating a control signal used for controlling an output condition of a tri-state buffer and a bi-directional (input/output) buffer.

The above and other objects of the present invention are achieved in accordance with the present invention by a semiconductor integrated logic circuit including:

a tri-state output buffer having three different output conditions of a logical high level, a logical low level and a high impedance condition;

an internal control circuit generating a control signal for controlling the tri-state output buffer;

a first selector having a first input receiving a data signal outputted from an internal logic circuit, a second input connected to receive the control signal, and an output connected to an data input of the tri-state output buffer; and a second selector having a first input connected to receive the control signal, and a second input connected to a predetermined logic level which brings the tri-state buffer into an output enable condition in which the tri-state output buffer outputs either the logical high level or the logical low level, an output of the second selector being connected to a control input of the tri-state output buffer, a selection control input of each of the first and second selectors being controlled by a common switch signal, so that when the common switch signal is indicative of a normal mode, the first selector selects and outputs the data signal to the data input of the tri-state output buffer and the second selector selects and outputs the control signal to the control input of the tri-state output buffer, and when the common switch signal is indicative of a test mode, the first selector selects and outputs the control signal to the data input of the tri-state output buffer and the second selector selects and outputs the logic level to the control input of the tri-state output buffer so that the tri-state buffer is brought in the output enable condition so as to output the control signal.

With this arrangement, by changing the common switch signal, the control signal is applied to control the tri-state buffer, or alternatively, the control signal is supplied as the data signal to the tri-state buffer. Accordingly, it is possible to know the control signal for the tri-state buffer, from the output of the tri-state buffer, in the test mode.

In a modification, the semiconductor integrated logic circuit includes an input buffer having an input connected to the output of the tri-state output buffer, so that a bi-directional buffer is constituted of the tri-state output buffer and the input buffer.

The above and other objects, features and advantages of the present invention will be apparent from the following description of preferred embodiments of the invention with reference to the accompanying drawings.

BRIEF DESCRIPTION OF THE DRAWINGS

FIG. 2 is a table illustrating an operation of the semiconductor integrated logic circuit shown in FIG. 1.

DESCRIPTION OF THE PREFERRED EMBODIMENTS

Figure 1:
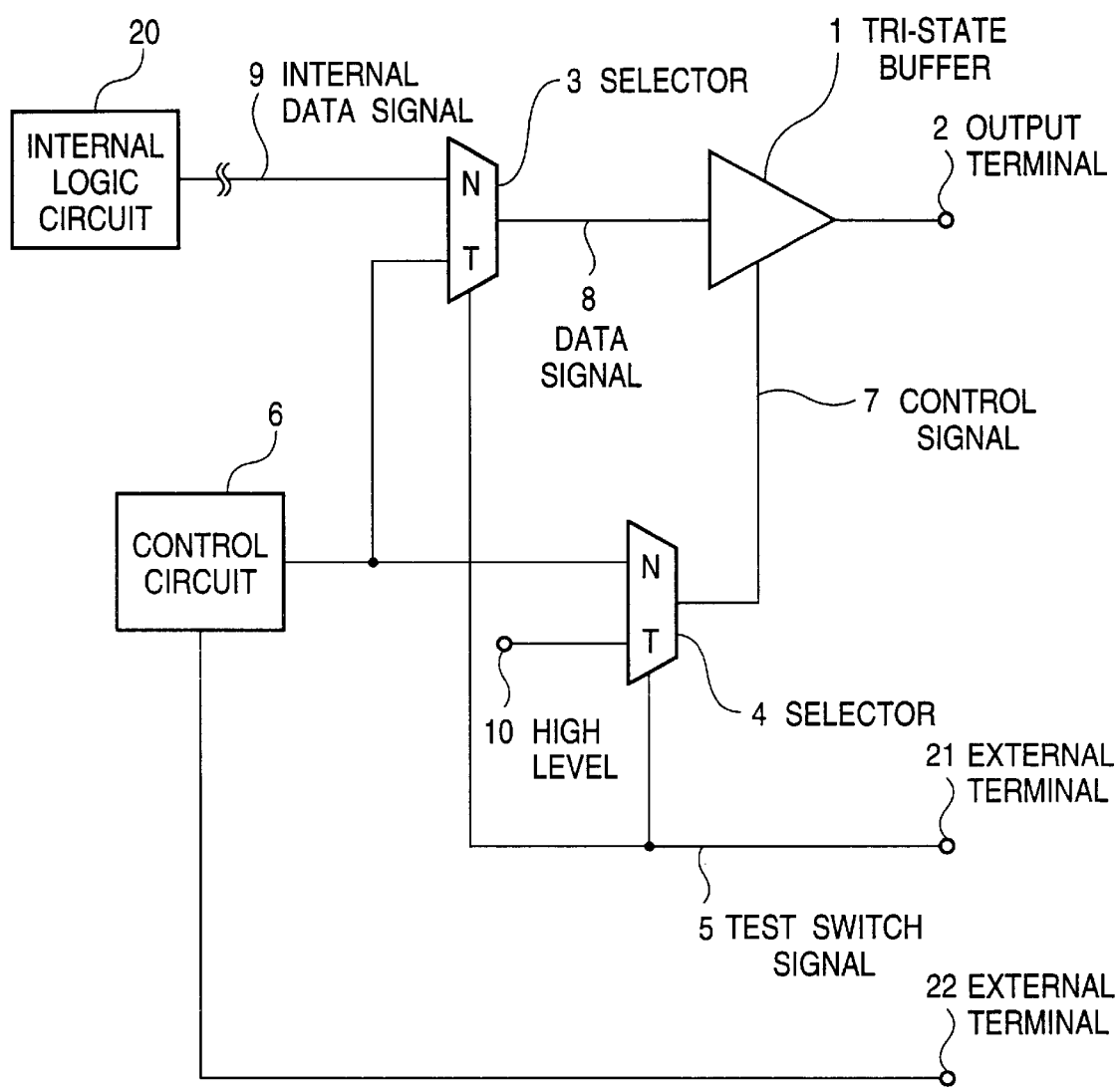
FIG. 1 is a circuit diagram of a first embodiment of the semiconductor integrated logic circuit in accordance with the present invention.

Referring to FIG. 1, there is shown a circuit diagram of a first embodiment of the semiconductor integrated logic circuit in accordance with the present invention.

Figure 3:
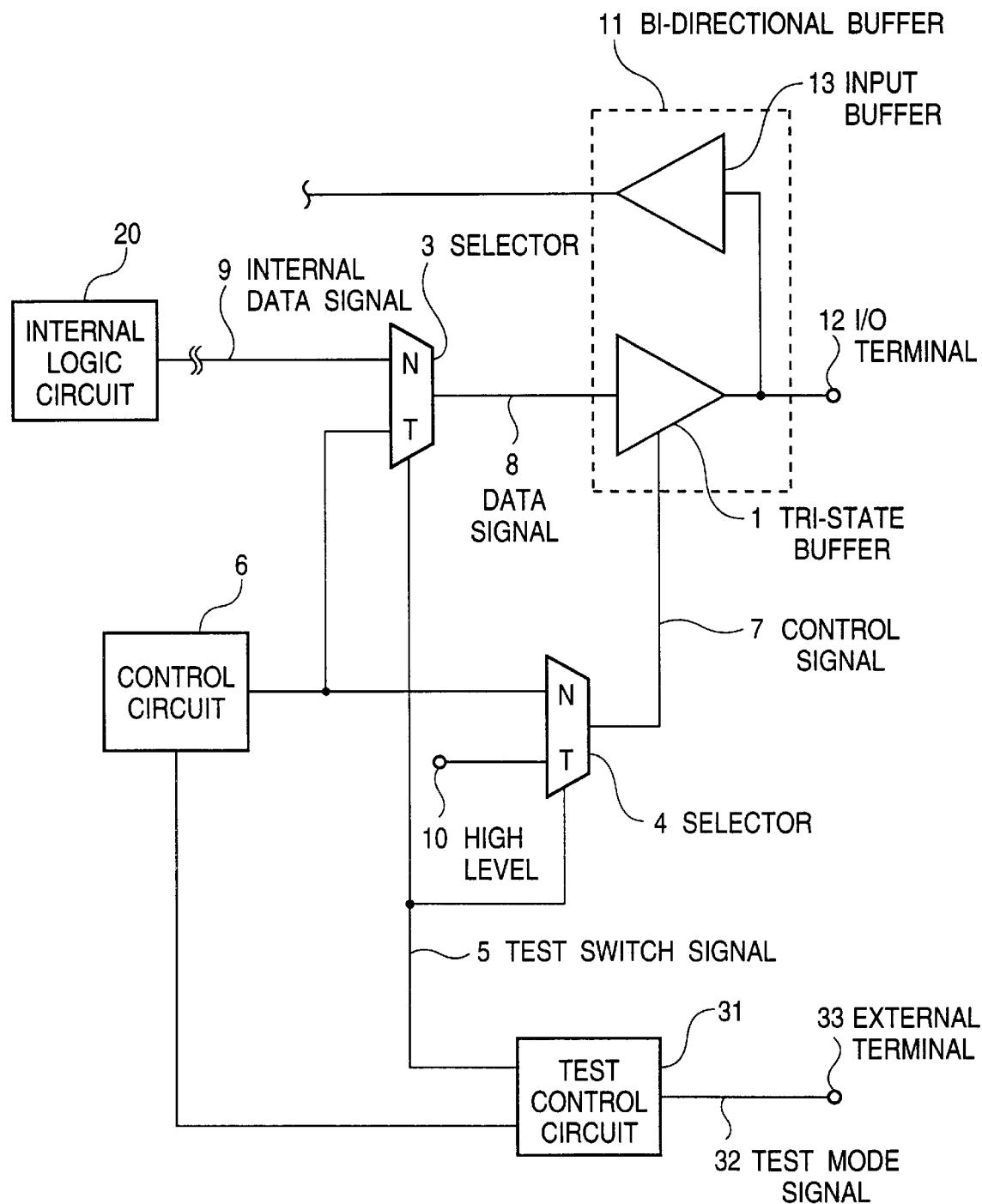
FIG. 3 is a circuit diagram of a second embodiment of the semiconductor integrated logic circuit in accordance with the present invention.

The shown semiconductor integrated logic circuit includes a tri-state buffer 1 having an output connected to an output terminal 2 of the semiconductor integrated logic circuit. An input of the tri-state buffer 1 is connected to receive a data signal 8 from an output of a first selector 3. A control terminal of the tri-state buffer 1 is connected to receive a control signal 7 from an output of a second selector 4. A switch control input of each of these selectors 3 and 4 is connected to receive a test switch signal 5 in common. In this first embodiment, this test switch signal 5 is supplied through an external terminal 21 of the semiconductor integrated logic circuit from an external device (not shown in FIG. 1). However, as an alternative, the test switch signal 5 can be supplied from an internal test control circuit 31 controlled in accordance with a test mode signal 32 supplied from an external device (not shown) through an external terminal 31 of the semiconductor integrated logic circuit, as shown in FIG. 3 which illustrates a second embodiment of the semiconductor integrated logic circuit in accordance with the present invention.

A first input (normal input) N of the first selector 3 is connected to receive an internal data signal 9 from an internal logic circuit 20, and a second input (test input) T of the selector 3 is connected to an output of a control circuit 6, which is provided to switch the tri-state buffer between an output enable condition (of outputting either a logical high level signal or a logical low level signal) and a high impedance output condition. A first input (normal input) N of the selector 4 is connected to the output of the control circuit 6, and a second input (test input) T of the selector 4 is connected to a logical high level 10. In a normal mode operation (namely, a non-test mode), the control circuit 6 is controlled by an internal circuit (not shown), as well known to persons skilled in the art. In this first embodiment, however, in a test mode, the control circuit 6 is controlled through a external terminal 22 of the semiconductor integrated logic circuit from an external device (not shown in FIG. 1). Alternatively, the control circuit 6 can be controlled by the internal test control circuit 31, as shown in FIG. 3, controlled in accordance with the test mode signal 32 supplied from an external device (not shown) through the external terminal 31 of the semiconductor integrated logic circuit.

Now, an operation of the shown semiconductor integrated logic circuit will be described with reference to FIG. 1 and also with reference to FIG. 2 which is a table illustrating an operation of the semiconductor integrated logic circuit shown in FIG. 1. In the table of FIG. 2, "X" under the column "INTERNAL DATA SIGNAL" indicates "Don't Care", namely, that the internal data signal may be any of the logical high level and the logical low level.

In a normal mode operation, the test switch signal 5 is inactive to indicate a normal mode, and the first and second selectors are controlled by the test switch signal 5 so that the first selector 3 selects and outputs the internal data signal 9 to the input of the tri-state buffer 1, and the second selector 4 selects and outputs the output signal of the control circuit 6 to the control terminal of the tri-state buffer 1 as the control signal 7.

In this case, when the output signal of the control circuit 6 is at a logical high level, the control signal 7 applied to the second terminal of the tri-state buffer 1 is also at the logical high level, so that the tri-state buffer 1 is put into an output enable condition. Accordingly, the internal data signal 9 is outputted to the output terminal 2 as it is. Namely, as shown in FIG. 2, when the internal data signal 9 is at the logical high level, the output terminal 2 of the tri-state buffer 1 becomes the logical high level, and when the internal data signal 9 is at the logical low level, the output terminal 2 of the tri-state buffer 1 becomes the logical low level. On the other hand, when the output signal of the control circuit 6 is at a logical low level, the control signal 7 applied to the control terminal of the tri-state buffer 1 is also at the logical low level, so that the output of the tri-state buffer 1 is brought into a high impedance condition "Hiz", regardless of the logical level of the internal data signal 9, as shown in FIG. 2.

When the test switch signal 5 is rendered active to indicate a test mode, the first and second selectors are controlled by the test switch signal 5 so that the first selector 3 selects and outputs the output signal of the control circuit 6 to the input of the tri-state buffer 1, and the second selector 4 selects and outputs the logical high level to the control terminal of the tri-state buffer 1 as the control signal 7. Accordingly, the tri-state buffer 1 is put into the enable condition, so that the output signal of the control circuit 6 is outputted from the tri-state buffer 1 regardless of the logical level of the internal data signal 9, as shown in FIG. 2.

In order to explain the above mentioned embodiment in more detail, explanation will now be made on one example in which the control circuit is tested by a testing circuit of an LSI tester.

In order to test whether or not the control circuit 6 operates properly, since the internal data signal 9 is outputted from the output terminal 2 when the output of the control circuit 6 is at the logical high level, a test pattern is previously prepared to realize such a condition, and the output terminal 2 is checked.

On the other hand, when the output signal of the control circuit 6 is at the logical low level, since the output terminal 2 is brought into the high impedance condition "Hiz", this is not checked by a conventional ordinary test apparatus. Therefore, if the control circuit 6 is a trouble and the control circuit 6 ceaselessly outputs the logical high level, the internal data signal 9 is outputted from the output terminal 2 as it is. In this case (the high impedance output condition), however, since the test apparatus does not check the value of the output terminal 2 as mentioned above, it is not possible to detect such a situation that the output of the control circuit 6 should be at the logical low level but actually at the logic high level.

In this embodiment, however, in order to know that for example the output of the control circuit 6 should be at the logical high level but actually at the logic low level because of the trouble of the control circuit 6, the test switch signal 5 is activated to indicate the test mode, so that the output of the control circuit 6 is outputted to the output terminal 2. Accordingly, the level of the output terminal 2 is compared with a logical high level which is an expected output value. This is equivalent to a situation that the control circuit 6 is directly tested. On the other hand, when the output of the control circuit 6 should be at the logical low level but actually at the logic high level because of the trouble of the control circuit 6, the test switch signal 5 is also activated to indicate the test mode. In this case, the output of the control circuit 6 is checked by checking the level of the output terminal 2.

Referring to FIG. 3, there is shown a circuit diagram of a second embodiment of the semiconductor integrated logic circuit in accordance with the present invention. This second embodiment is that the present invention is applied to a bi-directional buffer. Therefore, in FIG. 3, elements corresponding to those shown in FIG. 1 are given the same Reference Numerals, and explanation thereof will be omitted.

As seen from comparison between FIGS. 1 and 3, the bi-directional buffer is designated with Reference Numeral 11, and includes the tri-state output buffer 1 having an output connected to an input/output terminal 12 and an input buffer 13 having an input connected to the input/output terminal 12. An output of the input buffer 13 is connected to an internal circuit (not shown) of the semiconductor integrated logic circuit.

In this embodiment, by activating the test switch signal 5 to indicate the test mode, the output of the control circuit 6 can be outputted to the input/output terminal 12, similarly to the first embodiment.

In this second embodiment, the test switch signal 5 is supplied from the internal test control circuit 31 controlled in accordance with the test mode signal 32 supplied from an external device (not shown) through the external terminal 31 of the semiconductor integrated logic circuit, and in the test mode, the control circuit 6 is controlled by the internal test control circuit 31. However, similarly to the first embodiment, the test switch signal 5 can be supplied through the external terminal 21 of the semiconductor integrated logic circuit as shown in FIG. 1, and in the test mode, the control circuit 6 is controlled through the external terminal 22 of the semiconductor integrated logic circuit also as shown in FIG. 1.

As seen from the above, since the output of the control circuit can be outputted to an external terminal by means of a simple circuitry, it is possible to check whether or not the circuit for controlling the tri-state buffer and the bi-directional buffer operates properly.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated logic circuit including:

a tri-state output buffer having three different output conditions of a logical high level, a logical low level and a high impedance condition;

an internal control circuit generating a control signal for controlling said tri-state output buffer;

a first selector having a first input receiving a data signal outputted from an internal logic circuit, a second input connected to receive said control signal, and an output connected to an data input of said tri-state output buffer; and a second selector having a first input connected to receive said control signal, and a second input connected to a predetermined logic level which brings said tri-state buffer into an output enable condition in which said tri-state output buffer outputs either the logical high level or the logical low level, an output of said second selector being connected to a control input of said tri-state output buffer.

a selection control input of each of said first and second selectors being controlled by a common switch signal, so that when said common switch signal is indicative of a normal mode, said first selector selects and outputs said data signal to the data input of said tri-state output buffer and said second selector selects and outputs said control signal to said control input of said tri-state output buffer, and when said common switch signal is indicative of a test mode, said first selector selects and outputs said control signal to the data input of the tri-state output buffer and said second selector selects and outputs said logic level to said control input of said tri-state output buffer so that said tri-state buffer is brought in said output enable condition so as to output said control signal.

2. A semiconductor integrated logic circuit claimed in claim 1 further including an input buffer having an input connected to said output of said tri-state output buffer, so that a bi-directional buffer is constituted of said tri-state output buffer and said input buffer.

* * * * *